United States Patent [19]

Durose

[11] Patent Number: 4,933,299
[45] Date of Patent: Jun. 12, 1990

[54] METHOD OF FORMING 3-D STRUCTURES USING MOVCD WITH IN-SITU PHOTOETCHING

[75] Inventor: Kenneth Durose, Ipswich, England

[73] Assignee: British Telecommunications public limited company, Great Britain

[21] Appl. No.: 322,124

[22] Filed: Mar. 13, 1989

[30] Foreign Application Priority Data

Mar. 22, 1988 [GB] United Kingdom ............... 8806800

[51] Int. Cl.$^5$ ............................................ H01L 21/20
[52] U.S. Cl. ............................. 437/81; 148/DIG. 6; 148/DIG. 51; 148/DIG.71; 148/DIG. 94; 148/DIG. 110; 156/613; 156/649; 427/53.1; 437/173; 437/228; 437/935; 437/936
[58] Field of Search .................. 148/DIG. 6, 22, 25, 148/26, 48, 50, 51, 65, 56, 71, 94, 93, 110, 169; 118/715, 720, 50.1, 620; 156/610–614, 643, 644, 647, 649, 662; 427/43.1, 53.1, 54.1, 55, 248.1, 255.1; 437/81, 105, 107, 108, 111, 112, 126, 133, 173, 228, 908, 915, 935, 936, 963

[56] References Cited

U.S. PATENT DOCUMENTS

| 4,421,576 | 12/1983 | Jolly ........................... 437/84 |
| 4,477,311 | 10/1984 | Mimura et al. .............. 156/643 |
| 4,560,576 | 12/1985 | Lewis et al. ................. 427/38 |
| 4,592,306 | 6/1986 | Gallego ....................... 118/719 |
| 4,624,736 | 11/1986 | Gee et al. .................... 156/643 |

OTHER PUBLICATIONS

Eden, "Photochemical Processing of Semiconductors," IEEE Circuits and Devices, Jan. 1986, pp. 18–24.
Uchida et al., ". . . In Situ Dry Etching and Deposition Processing System," IEEE J. Quan. Elect., vol. 24, No. 11, Nov. 1988, pp. 2170–77.
Aoki et al., "Effect of Photochemical Etching . . .", Electron. Lett., 13th Aug. 1987, vol. 23 No. 17, pp. 891–892.

Primary Examiner—Brian E. Hearn
Assistant Examiner—William Bunch
Attorney, Agent, or Firm—Nixon & Vanderhye

[57] ABSTRACT

MOVPE growth and photoetching are integrated into a unified sequence which is carried out without removing a workpiece from a MOVPE reactor. Growth may be carried out before, after or before and after the etching.

To prevent pattern broadening by diffusion of the active species the substrate is preferably protected by a fugitive coating which is removed by the illumination. Native oxide coatings are particularly suitable for InGaAsP substrates. These are conveniently applied for exposing to substrate to 20°/o $O_2$+80°/o $N_2$ for about 3 minutes at 450° C.

28 Claims, 1 Drawing Sheet

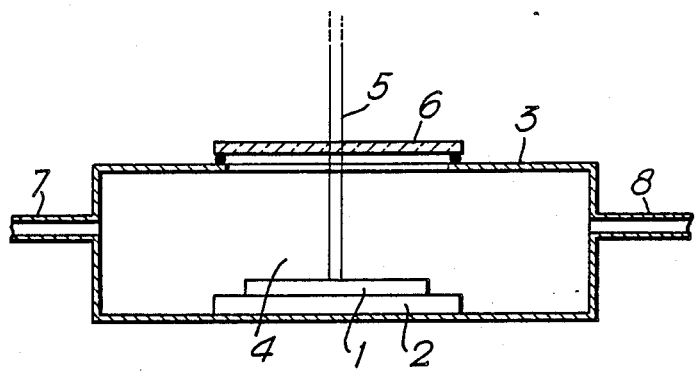

METHOD OF FORMING 3-D STRUCTURES USING MOVCD WITH IN-SITU PHOTOETCHING

The present invention relates to a method of etching and finds particular application in the field of opto-electronic device production.

Opto-electronic devices are becoming of increasing importance, particularly in communications as the use of optical communications becomes widespread. Methods that can be used in the production of opto-electronic devices are therefore also of increasing importance. Silica optical fibers, the basis of modern optical communication systems, as produced in recent years have loss minima at 1.3 $\mu$m and 1.55 $\mu$m approximately, the latter minimum being the deeper. Accordingly there is an especial need for opto-electronic devices operating in the range from 1.1 to 1.65 $\mu$m, especially from 1.3 to 1.6 $\mu$m. (These wavelengths, like all the wavelengths herein except where the context indicates otherwise, are in vacuo wavelengths.

Devices operating in this region of the infra-red, such as semiconductor lasers, usually comprise regions of materials containing at least one element selected from Group III and at least one element selected from Group V of the periodic table (III-V materials).

Examples of such materials include indium phosphide (InP), and the quaternary materials, the indium gallium arsenide phosphides ($In_xGa_{1-y}As_yP_{1-}$). With regard ot the latter, by suitable choices of x and y it is possible to lattice-match the various regions while varying the band gaps of the materials. (Band gaps can be determined experimentially by, for example, photoluminescence).

Further examples of III-V materials include gallium aluminium adrsenide (GaAlAs) and gallium arsenide (GaAs). Devices comprising regions of these materials are also used for communications purposes. These devices operate near to 0.9 $\mu$m.

Additionally the III-V materials can be doped to be p-type or n-type as desired. It is convenient to use the term III-V semiconductor to refer to both doped and undoped material.

The production of opto-electronic devices generally involves the processing of the surface of a solid substrate, either by etching or by material deposition. A known method of processing a solid substrate is to illuminate a molecular gas in the close vicinity of the substrate. By combining a selected gas, either alone or with an inert diluent gas, with light including radiation of a particular wavelength or wavelengths, photodissociation of the gas can be caused. Depending on whether the active species so produced reacts with or is absorbed on the surface of the substrate, either etching or deposition can occur.

III-V materials can be etched using halogenated hydrocarbon gases illuminated at ultra-violet (u-v) wavelengths. In a paper by D. J. Ehrlich et al, "Laser Microphotochemistry for Use in Solid-State Electronics", IEEE Journal of Quantum Electronics, Vol QE-16(11) November 1980, methods of etching InP and GaAs are described.

It is considered in the above paper that etching of the substrate surfaces is caused by the chemisorption of photodissociated halide atoms onto the substrate surface, followed by formation and vaporisation of product salts. For instance, GaAs can be etched by photodissociation of $CH_3Br$ to give Br atoms and $CH_3$ radicals.

It has been reported that there are advantages in using photochemical etching in device production, e.g. where the light used is laser-produced. The photodissociation on which the process relies occurs only in the presence of light and a focussed or otherwise narrow laser beam can therefore be used to produce highly localised etching. This has the advantage that patterns can be etched by scanning of the laser beam rather than by the use of a mask. By eliminating the use of a mask, production rates can be increased.

Our European patent specification No. 0209288 describes a method of etching a surface, whose elemental constituents are selected from Groups III and V of the Periodic Table, which method comprises exposing the surface to free halide radicals in a reducing environment such as $H_2$ gas.

In applying this method we observed that the patterns produced by the scanning of a laser beam are not as sharp as we had expected. It is an object of this invention to produce a sharper pattern.

This invention includes two aspects.

According to the first aspect growth and photoetching are integrated into a unified sequence using the same MOVPE reactor. This is advantageous because workpieces are only exposed to the atmosphere of MOVPE reaction chambers which are even more controllable than the atmospheres of clean rooms. Additionally the risks of handling are also reduced.

Many devices include structural features which are shaped in three dimensions, e.g. structures which project from surrounding regions. Such structural features include (a) optical path regions in integrated devices and (b) mesas. The structural regions are produced by removing surrounding regions. Thus first predetermined regions are removed in preference to second predetermined regions. The second regions thus remain behind to become the structural features in the finished devices. When a mesa or path region is required, the first predetermined regions correspond to grooves on either side thereof. The second predetermined region, i.e. the material left behind between the grooves, forms the mesa or the path region in the finished device.

In many devices the three dimensional features are wholly or partly covered with overgrowth. Thus the invention includes integrated sequences in which MOVPE growth occurs before, or after, or both before and after photoetching.

According to the second aspect of this invention the substrate is coated with a fugitive protective coating before photoetching, e.g. before exposing the workpiece to the precursor of an active species and to suitable radiation. The radiation has two functions, i.e.

(i) it removes the fugitive coating, e.g. by evaporation, and (ii) it generates the active species which etches the surfaces, e.g. by decomposing the precursor.

The removal of the fugitive coating, i.e. (i) above, allows the active species to have access to the substraste. It is convenient to use the same wavelength of radiation for both (i) and (ii) above. This may not be convenient, e.g. if the wavelength most effective for removing the coating differs from the wavelength most effective for generating the active species. In this case a first wavelength is used for step (i) and a second, different, wavelength is used for step (ii). Two two wavelengths may be used simultaneously or sequentially.

The pattern of radiation controls the removal of the coating and also the etching process. Where two wavelengths are used it is not necessary for the two pattens to be the same. The pattern of illumination can be created either by scanning with beams of illumination, e.g. by tracking a laser, or by projecting an image. Material is preferentially removed where the radiation is more intense or more prolonged.

It is beleived that the fugitive coating works as follows. The radiation causes the precursor to dissociate to generate the active species. The active species are generated within the illuminated volume occupied by precusors. However, the active species are able to migrate from the place where they are generated, e.g. by diffusion. Thus, in the case of an uncoated substrate, etching takes place not only where the radiation is intense but also in the surrounding regions. For example, if a laser describes a predetermined path in order to etch a groove, etching will also occur on both sides of the path so that the result is a more diffuse groove that would have been predicted. According to the invention the substrate is protected by the fugitive coating. The removal of the coating is much more precisely limited to the region where radiation is intense, e.g. the point of focus of the laser. The active species will still diffuse away from the place where they are created but they will not be able to attack the substrate where the fugitive coating remains intact. Since the coating remains intact where radiation is less intense, e.g. on both sides of laser track, a much sharper pattern results.

It should be appreciated that the coating is only required to protect the substrate against the low concentrations of the active species caused by diffusion. Nonetheless coatings less than about 1 nm thick may be too readily damaged and provide inadequate protection. On the other hand coatings thicker than 20 nm will be very difficult to remove by the illumination. Thus coatings between 2 and 15 nm thick are particularly suitable. Since the coating is almost always removed after etching there is no point in making it thicker than is necessary to protect the substrate.

This invention is particularly suitable for etching the materials mentioned in our earlier EP No. 209288i.e. materials containing at least one element selected from Group III and at least one element selected from Group V of the periodic table (III/V materials). Examples of these materials include indium phosphide (InP), gallium arsenide (GaAs) together with ternary and quaternary compounds of these, i.e. $In_xGa_{(1-x)}As_yP_{(1-y)}$ where x and y are independently 0 to 1. As stated above these materials are used to make semiconductor lasers which are often grown by MOVPE. They usually contain dopants but these are only in low concentrations so that the etching process is not substantially affected. Many substrates contain only the elements In, Ga, As, P and dopants. It will be apparent that these substrates are suitable for processing by the invention.

The fugitive coating is conveniently a native oxide coating, i.e. and oxide of the substrate material. This is particularly suitable for III-V substrates. The coating is conveniently obtained by exposing the substrate to an atmosphere which contains oxygen, e.g. mixtures of pure $O_2$ and a pure inert gas such as $N_2$, at a temperature and for a time suitable to produce an oxide coating 2 to 15 nm thick. Precise temperature, oxygen concentration and time may be varied over wide ranges. It is expected that these will be chosen to suit the convenience of the operator.

Thus substrates which contain at least one of In and Ga and at least one of As and P will form oxide coatings with the full range of oxygen concentrations, e.g. 0.5 to 100 mole %. For convenient reaction speeds we recommend concentrations of 10 to 30 mole %. For substrates which contain a high proportion of P, the reaction temperature should be below 500° C., preferably below 450° C., to avoid damage to the substrate. Temperatures above 200° C, especially above 350° C., are advisable to avoid reaction times which are inconveniently long, e.g. more than one hour. If longer times are acceptable, e.g. to provide maximum protection for the substrate temperatures as low as 100° C. may be used. It will be appreciated that the time will depend on both temperature and oxygen concentration. Times in the range 1 to 15 minutes are suggested for oxygen concentrations of 10 to 20 mole % at 200° C. to 450° C.

As an alternative to oxide coatings, there may be used other coatings which are evaporated, decomposed or otherwise removed by suitable illumination. For example, coatings may be deposited by sputtering or condensation on the surface. A wide range of inorganic halides and oxides are available.

The preferred active species, especially for use with the In, Ga, P, As compounds as mentioned above, are halide atoms, e.g. Br or I atoms and/or alkyl radicals. These are conveniently generated by the action of light on photo-dissociable precursors such as halogenated hydrocarbons especially those with up to 5 carbon atoms, e.g. $CH_3Br$ and $CH_3I$. Light of frequency 257 nm can be used to dissociate these hydrocarbons. The partial pressure of the precursor is preferably 1/100 to 1/5 of the total pressure and, as is disclosed in our earlier specification, the precursor is preferably diluted with hydrogen.

When scanning is used, illumination, e.g. a laser, is focused onto the surface of the substrate and relative motion is initiated so that the spot moves at a rate of 100-500 nm/sec. As stated above, the spot removes the protective coating but only where it impinges thereon. It also dissociates the precursor to generate the active species. Although the active species diffuses it can react only where the protective layer is removed.

This method of etching is particularly suitable for etching III/V semiconductors grown by MOVPE (which involves passing a cold stream of reagents such as $In(CH_3)_3$, $Ga(CH_3)_3$, $PH_3$ and $AsH_3$ diluted with $H_2$ over a heated substrate). It is convenient to carry out the etching method inside the MOVPE reaction chamber. This avoids the need to remove the substrate from the MOVPE reactor and hence avoids exposure to the general enviroment.

A suitable sequence would be:
(a) Replace MOVPE reagents by a mixture of $O_2$/inert gas ($N_2$), preferably containing 10-30 mole % of $O_2$;
Heat the substrate to 100° to 450° C. until a suitable oxide coating is achieved;
(c) Replace the $O_2$ by a mixture of $H_2$ and the precursor for the active species;
(d) Switch on the illumination and thereby etch. When appropriate, the MOVPE reaction chamber can be moved to track a laser beam;
(e) Exclude the precursor (leaving the $H_2$);
(f) Re-initiate the MOVPE.

Step (f) includes heating the substrate under $H_2$, optionally with reagents such as $PH_3$ and $AsH_3$ to reduce decomposition of the substrate. During the heating the $H_2$ removes the oxide film formed during step (b).

The method described above is suitable for the preparation of etched grooves in InP and other III–V materials in opto-electronic integrated circuitry (OEIC's). For example the invention can be used to make integrated wave guiding structures by etching a layer of high refractive index grown over a layer of lower refractive index. Using the technique of the invention parallel grooves are etched into the layer of high refractive index. The grooves are spaced apart so that a ridge is left between them. An over layer of lower refractive index then grown over the etched layer (after removing the protective coating). This leaves the ridge as an isolated region of higher refractive index surrounded by material of lower index, i.e. a waveguide. A similar technique can also be used to produce mesas in laser structures.

Since the laser can track complicated patterns (and complicated images may be projected) the structural features, e.g. waveguides can have curved or otherwise complicated shapes.

A method of etching an InP substrate according to an embodiment of the invention will now be described by way of example only, with reference to the accompanying drawing, which shows a cross-section of part of an arrangement for etching the substrate.

The FIG. is schematic only and is not drawn to scale.

In order to oxide coat and then etch the substrate 1 it is mounted on a support 2 in a cell 3 (which is also suitable for use as a MOVPE reaction chamber). The cell 3 is provided with a u-v transparent window 6 and a laser (not shown) is mounted so that its beam 5 passes through the window 6 and impinges on the substrate 1. A gas mixture 4 flows through the cell 3, via and inlet 7 and an outlet 8, over the substrate 1.

The laser is an argon ion with a frequency double to produce radiation at 257 nm. The laser operated continuously at a power of 30 m. watt and the radiation was focused to a spot of 30 $\mu$m diameter.

The substrate was a wafer, about 200 to 300 $\mu$m thick, of n-doped InP. Before starting to etch the substrate was coated with a protective oxide layer about 6 nm thick as assessed by ellipsometry. The coating was applied in the cell 3. The method comprised filling the cell (at one atmosphere) with a mixture of pure $O_2/N_2$ in mole ratio $O_2:N_2=1:20$ and heating the substrate to a temperature of 450° C. (i.e. hot substrate, cold gas) for 3 minutes.

After oxidation the $O_2/N_2$ mixture was replaced by etchant atmosphere, namely a mixture of methyl iodide and hydrogen which was supplied to the cell 3 such that it flowed over the substrate 1 at a rate lying the range from 10 to 100 cm$^3$/min, inclusive. The partial pressure of methyl iodide in the mixture was in the range from 1 to 100 Torr inclusive and the partial pressure of hydrogen in the mixture made up the difference betwee that and atmospheric pressure, 760 Torr.

The spot of the laser beam 5 was scanned over the substrate 1 at a rate of 200 $\mu$m/sec in the presence of the gas mixture. After etching the oxide coating was removed by reduction with hydrogen.

The etching method described is similar to that disclosed in our earlier EP No. 909288. difference resides in the use of the protective coating.

Comparitive tests were carried out in which one substrate was coated and etched as described above, i.e. in accordance with the invention. The control test was carried out using a "clean", i.e. no protective coating, substrate as disclosed in EP No. 909288. The etching sequences were as alike as possible.

The invention gave a groove about 40 $\mu$m wide, i.e. about the same as the diameter of the spot. (Note, at the scale in question the edge of the spot is slightly fuzzy so it is inappropriate to make an exact comparison between groove width and spot diameter). The depth of the groove was about 3 $\mu$m. The width at the bottom was about 20 $\mu$m, i.e. about half the width at the top.

In a control test using the clean substrate the total depth was about 0.7 $\mu$m but the width at the top was about 300 $\mu$m, i.e. more than 10 times the width of the inventive groove.

In a control test using the clean substrate the total depth was 50 shallow and the 'groove' so broad that it was difficult to observe by microscopy. By reducing the spot scan velocity to 1 $\mu$m/s an easily observed groove having a depth of about 0.7 $\mu$m and a width of at least 400 $\mu$m was created. This width was 10 times that of the inventive groove.

Similar comparative tests were carried out using patterns of light projected onto both clean and coated substrates. In the case of clean substrates the features so produced were much broader than the illuminated areas of the substrate, e.g. a 40 $\mu$m feature was broadened to approximately 400 $\mu$m. When coated substrates were used the feature width was confined to the illuminated area (as in the case when a spot of light is traversed over the substrate). In the case of both coated and uncoated substrates the depth of the etched features could be increased by increasing the exposure time used, the vertical rate of etching being between 0.2 and 4 $\mu$m/hour depending on the exact experimental conditions used.

This comparison illustrates the effect of a fugitive protective coating in accordance with the invention. The coating limits etching to where the laser spot or other illumination impinges on the coating. Thus the inventive method produces steep sided grooves of similar width to the spot. According to the prior art, i.e. without the coating, the etching spreads at least 5 times the spot diameter on both sides (i.e. 10 times in total). Thus wide grooves with gently sloping sides are produced.

In further experiments using coating according to the invention the spot was traversed more than once over the same track. This re-trace produces a deeper groove without (provided the tracking was accurate) increasing the width of the groove. The width of the groove at the bottom was about 20 $\mu$m, about half the width at the top.

I claim:

1. A method of preparing a semiconductor device which device includes structural features shaped in three dimensions, which method comprises:
   (a) using MOVPE to grow one or more expitaxial layers onto a primary substrate; and
   (b) photoetching the product of (a) to create the structural features by removing predetermined regions of material,
wherein steps (a) and (b) are performed in a MOVPE reactor without removing the workpiece therefrom between steps (a) and (b).

2. A method according to claim 1, wherein a fugitive coating is applied between steps (a) and (b), and said fugitive coating is selectively removed during step (b).

3. A method of preparing a semiconductor device which device includes structural features shaped in three dimensions and wholly or partly covered by semiconductor overgrowth, which method comprises:

(b) photoetching a semiconductor substrate to create precursors of the structural features by removing predetermined regions of material, and (c) using MOVPE to deposit one or more layers of epitaxial overgrowth onto the product of (b), wherein steps (b) and (c) are preformed in a MOVPE reactor and without removing the workpiece therefrom between steps (b) and (c).

4. A method according to claim 3, wherein a fugitive coating is applied before step (b) and said fugitive coating is selectively removed during step (b).

5. A method of preparing a semiconductor device which device includes structural features shaped in three dimensions and covered by semiconductor overgrowth, which method comprises:

(a) using MOVPE to grow one or more epitaxial layers onto a primary substrate;

(b) photoetching the product of (a) to create precursors of the structural features by removing predetermined regions of material; and (c) using MOVPE to deposit one or more layers of epitaxial overgrowth onto the product of (b), wherein steps (a), (b) and (c) are performed in a MOVPE reactor without removing the workpiece therefrom.

6. A method according to claim 5, wherein a fugitive coating is applied between step (a) and step (b), and said fugitive coating is selectively removed during step (b).

7. A method of growing a semiconductor device which device includes structural features shaped in three dimensions and covered by semiconductor overgrowth, which method comprises:

(a) using MOVPE to grow one or more epitaxial layers onto a primary substrate;

(a)(i) applying a fugitive coating to the product of (a); p1 (b) photoetching the product of (a)(i) to create precursors of the structural features by removing predetemined regions of material, the fugitive coating applied in step (a)(i) being selectively removed as a preliminary to etching; (c)(i) using MOVPE to deposit one or more layers of epitaxial growth onto the product of (b) said growth being excluded on the regions still selectively coated with the coating applied in step (a)(i);

(c)(ii) removing the remainder of said fugitive coating and (c)(iii) using MOVPE to apply secondary overgrowth to the product of step (c)(ii), where steps (a), (a)(i), (b), (c)(i), (c)(ii) and (c)(iii) are all performed in a MOVPE reactor without removing the workpiece therefrom.

8. A method according to claim 7, in which the structural feature is a mesa or an optical path region and step (b) involves etching grooves on each side of the mesa.

9. A method of selectively etching a semiconductor substrate to remove material from first predetermined regions in preference to second predetermined regions which method comprises applying a fugitive coating to the surface of both side first and second predetermined regions and thereafter photoetching the workpiece to as to remove material preferentially from said first predetermined regions.

10. A method according to claim 9, wherein an image is projected onto the coated surface which image is more intense on the surface of the first predetermined regions than on the surface of the second predetermined regions whereby the coating is preferentially removed from the surface of the first predetermined regions.

11. A method according to claim 9, wherein the surface of the first predetermined regions is scanned with radiation adapted to removed the fugitive coating whereby the coating is preferentially removed from the scanned regions.

12. A method according to claim 9, wherein a first wavelength of illunination is used to removed the coating and a second wavelength is used to initiate the etch.

13. A method according to claim 12, wherein the workpiece is uniformly illuminated with the second wavelength after the coating has been preferentially removed with the first wavelength.

14. A method according to claim 9, wherein the coating is selectively removed and the photoetching is initiated with the same wavelength of illumination whereby coating removal and commencement of etching occur substantially at the same time.

15. A method according to claim 9, wherein the substrate is exposed to the precursor of an active etchant species and the initiating radiation is adapted to dissociate said precursor into said active etchant species.

16. A method according to claim 15, wherein the precursor of the active etchant species is a halogenated hydrocarbon.

17. A method according to claim 15, wherein the active etchant species is selected from halogen atoms and alkyl radicals.

18. A method according to claim 15 wherein the precursor is selected from an alkyl bromide or an alkyl iodide diluted with hydrogen whereby the active species is selected from iodine atoms, bromine atoms and alkyl radicals.

19. A method according to claim 18, wherein the atmosphere contains a partial pressure of 1 to 100 Torr of methyl iodide or methyl bromide.

20. A method according to claim 9, in which the protective coating is an inorganic chloride or oxide.

21. A method according to claim 20, wherein the protective coating is a native oxide.

22. A method according to claim 21, wherein the coating is applied by exposing the substrate to an atmosphere which contains oxygen.

23. A method according to claim 9, wherein the substrate is formed of a semiconductor which contains at least one of In and Ga and at least one of P and As, wherein the method of applying the protective coating comprises producing a native oxide coating 1 to 20 nm thick by exposing the surface of the substrate to an atmosphere which contains oxygen.

24. A method according to claim 23, wherein the surface is exposed to an atmosphere which consists of 1–30 mole % $O_2$ and an inert gas for 1–15 minutes at 200° C. to 450° C.

25. A method of etching a three dimensional pattern into the surface of a substrate which surface is protected by a fugitive coating wherein the surface is exposed to the precursor of an active etchant species and a predetermined pattern of radiation is applied to the surface of the substrate, said radiation being adapted to dissociate the precursor into active species and to remove the protective coating whereby material is removed where the radiation is applied so as to create said three dimensional pattern.

26. A method of preparing a semiconductor device which device includes a mesa, which method comprises:

(a) using MOVPE to grow one or more epitaxial layers onto a primary substrate; and
(b) photoetching the product of (a) to create grooves on each side of the intended mesa, wherein steps (a) and (b) are preformed in a MOVPE reactor without removing the workpiece therefrom between steps (a) and (b).

27. A method of preparing semiconductor device which device includes a mesa wholly or partly covered by semiconductor overgrowth, which method comprises:
   (b) photoetching a semiconductor substrate to create grooves on each side of the intended mesa, and
   (c) using MOVPE to deposit one or more layers of epitaxial overgrowth onto the product of (b), wherein steps (b) and (c) are performed in a MOVPE reactor and without removing the workpiece therefrom between steps (b) and (c).

28. A method of preparing a semiconductor device which device includes a mesa covered by semiconductor overgrowth, which method comprises:
   (a) using MOVPE to grow one or more epitaxial layers onto a primary substrate;
   (b) photoetching the product of (a) to create grooves on each side of the intended mesa; and
   (c) using MOVPE to deposit one or more layers of epitaxial overgrowth onto the product of (b), wherein steps (a), (b) and (c) are performed in a MOVPE reactor without removing the workpiece therefrom.

* * * * *